United States Patent [19]

Komagata et al.

[11] Patent Number: 5,138,267
[45] Date of Patent: Aug. 11, 1992

[54] METHOD OF CALIBRATING OUTPUT LEVELS OF A WAVEFORM ANALYZING APPARATUS

[75] Inventors: Shigemi Komagata, Kitaadachi; Masahisa Hirai, Kazo, both of Japan

[73] Assignee: Advantest Corporation, Tokyo, Japan

[21] Appl. No.: 647,593

[22] Filed: Nov. 29, 1990

[30] Foreign Application Priority Data

Dec. 1, 1989 [JP] Japan ................... 1-312367
Dec. 1, 1989 [JP] Japan ................... 1-312368

[51] Int. Cl.$^5$ .......................... G01R 23/16
[52] U.S. Cl. ....................... 324/601; 324/603; 324/623; 341/120
[58] Field of Search ........... 341/120; 364/571.01, 364/571.04; 324/74, 601, 603, 623

[56] References Cited

U.S. PATENT DOCUMENTS

| | | | |
|---|---|---|---|
| 3,349,195 | 10/1967 | Gray | 341/120 |
| 3,736,504 | 5/1973 | Koide | 324/74 |
| 4,023,093 | 5/1977 | Roth | 324/603 |
| 4,067,060 | 1/1978 | Poussart | 324/77 B |
| 4,450,411 | 5/1984 | Spurr | 324/74 |
| 4,583,075 | 4/1986 | Sloane | 341/120 |
| 4,633,173 | 12/1986 | Kashiwagi | 324/74 |
| 4,700,129 | 10/1987 | Yoshizawa | 324/601 |
| 4,799,008 | 1/1989 | Kannari | 324/74 |

*Primary Examiner*—Kenneth A. Wieder
*Assistant Examiner*—Jose M. Solis
*Attorney, Agent, or Firm*—Staas & Halsey

[57] ABSTRACT

The present invention relates to a method of calibrating levels of a waveform analyzing apparatus. An analog switch produces a square wave signal of a low frequency by switching ON and OFF a preset level of DC voltage from a DC voltage setting circuit at a frequency of a control signal from a frequency setting circuit. The square wave signal is applied to the waveform analyzing apparatus and the low frequency output level is calibrated by a theoretical level of a frequency spectrum of the square wave signal. A diode detecting circuit is calibrated at the low frequency using the calibrated waveform analyzing apparatus, which in turn is calibrated at a high frequency using the calibrated diode detecting circuit. The diode detecting circuit, the analog switch and a switch circuit are provided on a performance board attached to an IC tester analog test part which includes the signal generators, the DC voltage setting circuit, the frequency setting circuit, the waveform analyzing apparatus, a DC voltmeter and a test processor. Using the switch circuit, desired outputs of the signal generators, analog switch and the diode detecting circuit are connected to desired inputs of the waveform analyzing apparatus, DC voltmeter and the diode detecting circuit, thus forming calibration equipment.

8 Claims, 8 Drawing Sheets

| FREQ [KHZ] | SETTING VOLTAGE | | | | | |
|---|---|---|---|---|---|---|
| | 10dBV | 3dBV | 0dBV | -3dBV | -10dBV | -20dBV |
| 2 | 1,0015 | 1,0016 | 1,0017 | 1,0020 | 1,0018 | 1,0032 |
| 10 | 1,0053 | 1,0059 | 1,0060 | 1,0070 | 1,0072 | 1,0076 |
| 18 | 1,0119 | 1,0130 | 1,0130 | 1,0128 | 1,0154 | 1,0156 |
| 30 | 1,0090 | 1,0100 | 1,0103 | 1,0137 | 1,0138 | 1,0143 |
| 38 | 1,0023 | 1,0037 | 1,0020 | 1,0063 | 1,0060 | 1,0067 |
| 50 | 1,0060 | 1,0076 | 1,0057 | 1,0076 | 1,0070 | 1,0096 |
| 58 | 1,0169 | 1,0190 | 1,0158 | 1,0015 | 1,0015 | 1,0180 |
| 70 | 1,0210 | 1,0203 | 1,0180 | 1,0122 | 1,0122 | 1,0164 |
| 78 | 1,0284 | 1,0287 | 1,0260 | 1,0155 | 1,0148 | 1,0219 |
| 90 | 1,0573 | 1,0589 | 1,0406 | 1,0377 | 1,0343 | 1,0455 |
| 98 | 1,0578 | 1,0595 | 1,0521 | 1,0334 | 1,0298 | 1,0440 |

METHOD OF CALIBRATING OUTPUT LEVELS OF A WAVEFORM ANALYZING APPARATUS

BACKGROUND OF THE INVENTION

1. Field of the Invention

The present invention relates to a method and equipment for calibrating output levels of a waveform analyzing apparatus called a digitizer in which an input waveform is sampled periodically, each sampled value is converted into digital data and stored in a memory and the stored data is fast Fourier-transformed into a frequency domain to thereby produce frequency components of the input waveform and levels of the respective components or output levels of a waveform analyzing apparatus of simple type called digital voltmeter which can measure both a square wave signal and a sine wave signal.

2. Description of the Prior Art

Figure 1:
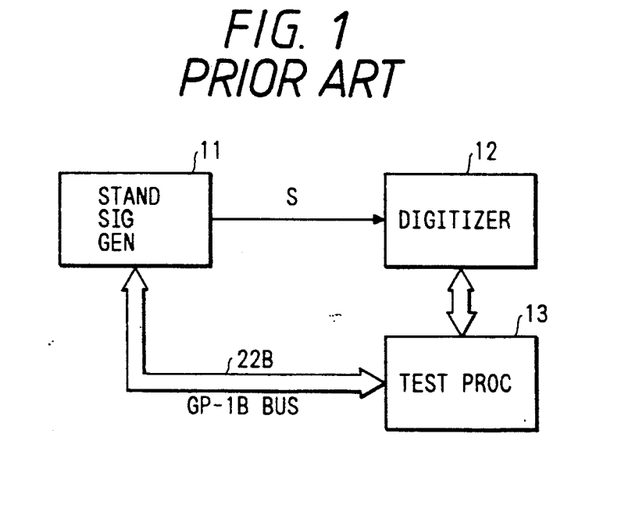
FIG. 1 is a block diagram used to explain an example of a conventional method of calibrating a level of a waveform analyzing apparatus.

FIG. 1 shows an example of a conventional method of calibrating a level of a waveform analyzing apparatus 12 provided in an analog test part of, for example, an IC (integrated circuit) tester.

According to the prior art, as shown in FIG. 1, a sine wave signal S of a predetermined frequency and a predetermined level is supplied from a calibrated standard signal generator 11 to a waveform analyzing apparatus 12, and a ratio between an output level of the waveform analyzing apparatus 12 at that time and the predetermined level of the input sine wave signal S is calculated as a correction coefficient for an output level in that frequency. Then, correction coefficients for a plurality of levels in a plurality of predetermined frequencies are calculated and stored in a memory of a test processor 13 as a table to thereby calibrate the level of the waveform analyzer 12. When the input waveform is analyzed by the waveform analyzer 12 after the calibration of the level of the waveform analyzer 12 has been finished, the test processor 13 reads the correction coefficients for frequencies and levels, which are analyzed results of the waveform analyzer 12, from the table and multiples the corresponding output levels with the correction coefficients to produce the multiplied output levels as measured results.

The aforenoted conventional method of calibrating the level of the waveform analyzing apparatus requires the expensive standard signal generator 11. Particularly, when the level of the waveform analyzing apparatus 12 provided in the analog test part of the IC tester is calibrated, the standard signal generator 11 is controlled by the test processor 13 of the tester via a GP-IB bus 22B. However, a transmission rate of the GP-IB bus 22 is low and also a plurality of levels of frequencies must be calibrated so that the standard signal generator 11 must be controlled a number of times, which takes a lot of time in calibrating the levels.

OBJECTS AND SUMMARY OF THE INVENTION

Accordingly, it is an object of the present invention to provide an improved method for calibrating the level of a waveform analyzing apparatus in which the aforenoted shortcomings and disadvantages of the prior art can be eliminated.

More specifically, it is an object of the present invention to provide a method of calibrating the level of a waveform analyzing apparatus in which the level of waveform analyzing apparatus can be calibrated in a short period of time by using a relatively inexpensive measuring apparatus.

Another object of the present invention is to provide calibrating equipment which does not require an expensive standard signal generator and can be formed simply by adding simple circuits to the analog testing part of an IC tester.

According to an aspect of the present invention, a square wave signal whose absolute level is assured is input to a waveform analyzing apparatus at a relatively low frequency, and an output level of the waveform analyzing apparatus at that time is calibrated by a theoretical value calculated from the above absolute level. Then, an alternate current signal of frequency substantially equal to the above frequency from a signal generator is supplied to the calibrated waveform analyzing apparatus and a detecting circuit and an output level of the detecting circuit at that time is calibrated by an output level of the waveform analyzing apparatus. The calibrated waveform analyzing apparatus and the calibrated detecting circuit are supplied with an alternate current signal of frequency higher than the above frequency from a signal generator and the output level of the waveform analyzing apparatus is calibrated by the output level of the thus calibrated detecting circuit at that time.

That is, the square signal of a predetermined level whose frequency is relatively low can be generated with ease and low cost. Accordingly, the output level of the waveform analyzing apparatus can be calibrated by utilizing the square wave signal with respect to the low frequency range, and the output level of the detecting circuit can be calibrated by utilizing the calibrated waveform analyzing apparatus. Since the input and output characteristic of the detecting circuit is flat in a wide range of frequency where an impedance of a coupling capacitor of the detecting circuit is negligible, a level correction coefficient at a relatively low frequency in the region in which the frequency characteristic is flat can be applied to a frequency range higher than the former frequency. Therefore, the level of the waveform analyzing apparatus can be calibrated with respect to the high frequency by using the detecting circuit whose level is calibrated.

In order to calibrate the output level of the detecting circuit in the above-mentioned calibration method of the present invention, instead of utilizing the calibrated waveform analyzing apparatus, it is possible to utilize a calibrated digital voltmeter which can measure an alternate current signal. Since the input and output characteristic of the detecting circuit is not flat in a relatively low frequency region, the level of the waveform analyzing apparatus is calibrated by the square wave signal whose level is preset.

In the case of calibration in the relatively low frequency region, a plurality of square wave signals whose amplitudes are known and which have predetermined duty ratios and different frequencies are simultaneously supplied to a digitizer, and the level of respective frequency components obtained as the outputs of the digitizer are calibrated by theoretical level values calculated from the known amplitudes, respectively.

The above, and other objects, features and advantages of the present invention will be apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

A first embodiment of the present invention will be described with reference to FIG. 2.

Figure 2:
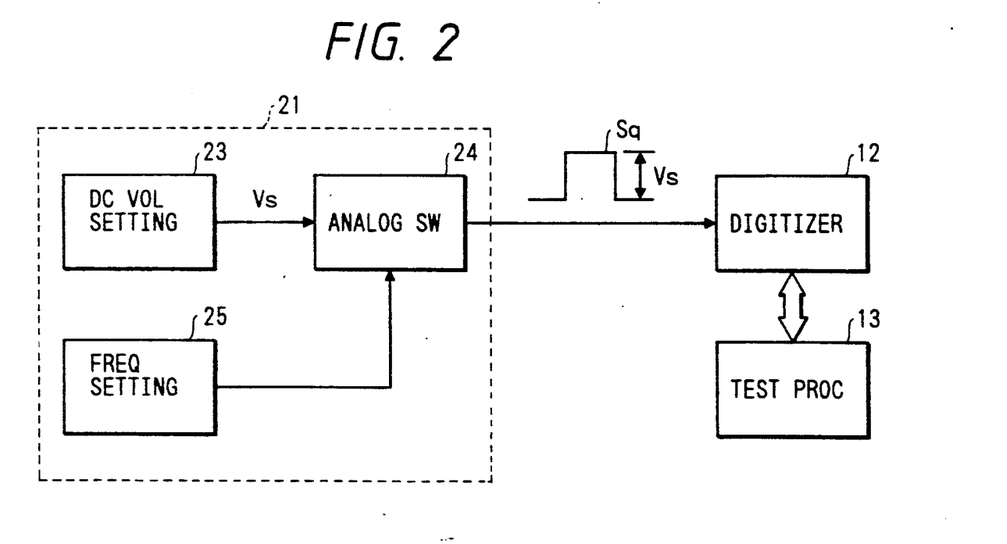
FIG. 2 is a block diagram showing an example of an arrangement for calibrating the level of waveform analyzing apparatus in the low frequency region according to the embodiment of the present invention.
Figure 3:
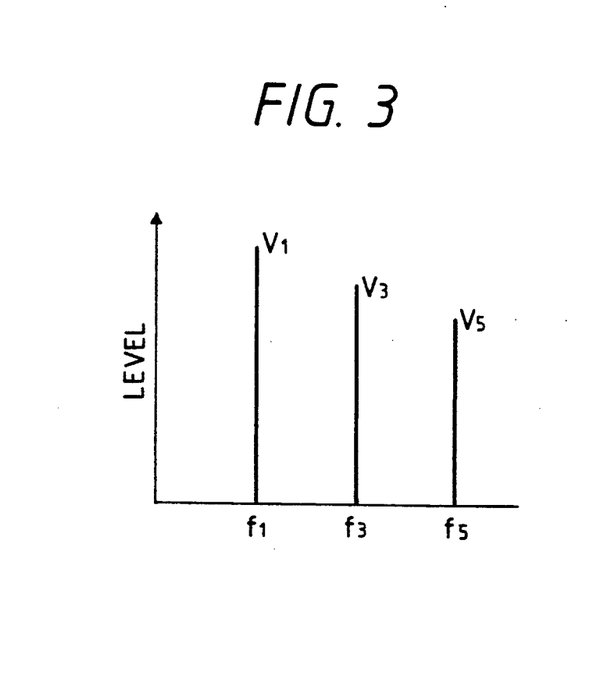
FIG. 3 is a diagram of frequency spectrum of a square wave signal.

It will be seen in FIG. 2 that a square wave signal generator 21 derives a square wave signal Sq whose absolute level Vs is assured and which has a relatively low frequency of about 100 kHz. In the square wave signal generator 21, a DC voltage Vs of a set level is supplied from, for example, a DC voltage setting circuit 23 to an analog switch 24 and the analog switch 24 is turned ON and OFF by a control signal of a set frequency from a frequency setting circuit 25, thereby generating the square wave signal Sq whose duty ratio is 50% in which the voltage thereof alternately changes between the input DC voltage Vs and the zero voltage. This square wave signal Sq is input to a waveform analyzing apparatus (i.e. digitizer) 12. The digitizer 12 processes the input square wave signal Sq in a fast Fourier transform fashion to derive level of primary component fundamental wave) $f_1$, levels of ternary, quinary harmonic components $f_3$, $f_5$ ... that is, levels $V_1$, $V_3$, $V_5$ ... of odd order harmonic components $f_1$, $f_3$, $f_5$, ... as shown in FIG. 3.

Figure 4:
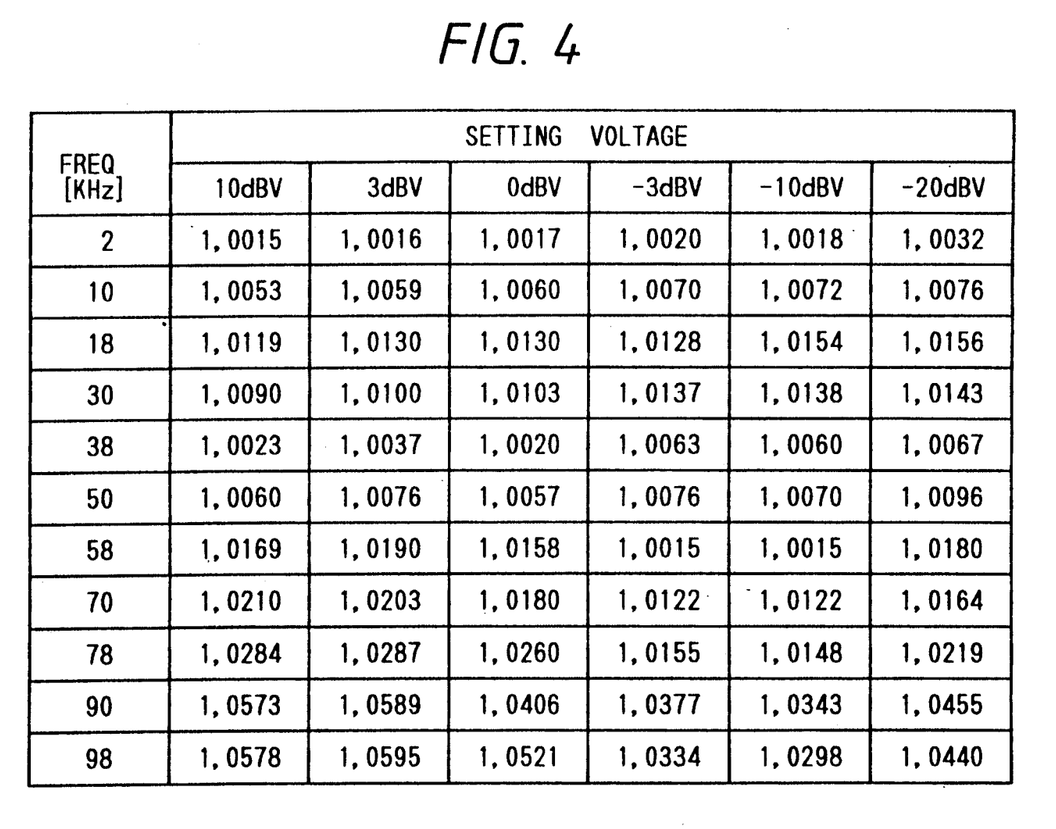
FIG. 4 is a table illustrating examples of correction coefficients store in a memory.

Since the levels of the harmonic components decrease with the increase of order, it is to be noted that the harmonic components suitable for calibrating the level are up to about 9-order harmonic components. Accordingly, when the levels of a number of frequency points are calibrated at desired frequency intervals, the frequency of the square wave signal must be changed. Here, only the level $V_1$ of the primary component $f_1$, for example, is calibrated by the level of the square wave signal Sq, that is, the set voltage Vs of the DC voltage setting circuit 23, and the similar calibration is repeated. It is known that a theoretical level of the primary component of the square wave signal having the duty ratio of 50% of the voltage Vs is presented as $V = 2Vs/\pi$. Accordingly, a ratio $r = V/V_1$ between the theoretical calculation voltage V and the output level $V_1$ of the primary component $f_1$ of the digitizer 12 is calculated and this ratio r is employed as the correction coefficient r which is used for correction of the measured level by the digitizer 12 in the frequency $f_1$. Then, correction coefficients r with respect to a plurality of levels in respective frequencies are determined by changing the setting level of the DC voltage setting circuit 23 and the setting frequency of the frequency setting circuit 25 and these correction coefficients are stored in the memory within the test processor 13 as a table, for example, shown in FIG. 4. This calibration is performed to the frequencies lower than about 100 kHz. In the frequency region higher than 100 kHz, it is usually difficult to generate a square wave signal whose level is assured. Therefore, the level calibration is carried out by the following method.

Figure 5:
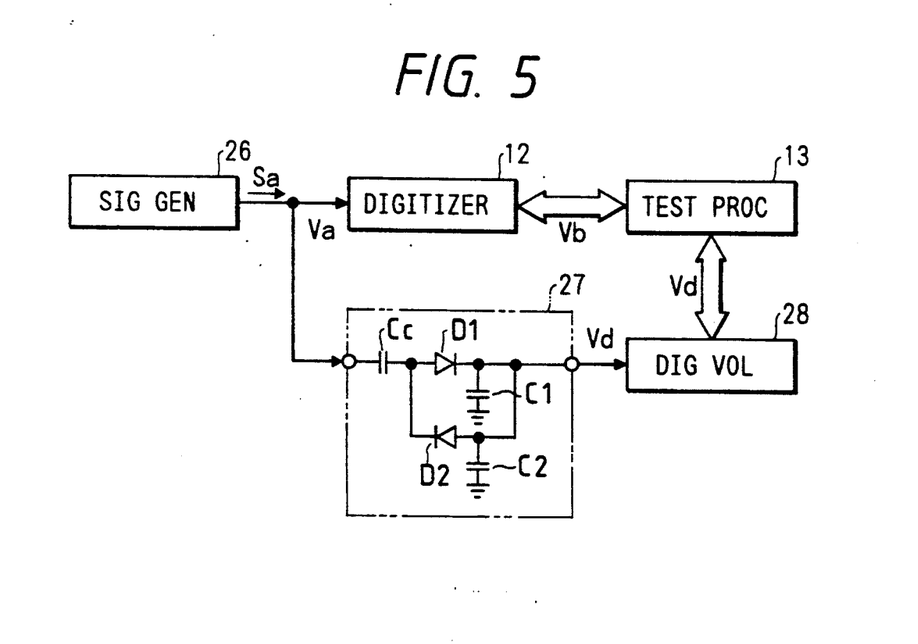
FIG. 5 is a block diagram showing an arrangement by which the level of a detecting circuit is calibrated.

In the calibration in the high frequency region, as shown in FIG. 5, an alternate current signal (sine wave signal) Sa having the frequency and level Va substantially equal to any one of frequencies and one of levels used in the calibration of FIG. 2 is generated from a non-calibrated signal generator 26. This alternate current signal Sa is supplied to the digitizer 12 whose level in the low frequency region is calibrated by the method of FIG. 2 and to a detecting circuit 27. Then, an output level Vd of the detecting circuit 27 at that time is calibrated by a corrected output level r·Vb of the digitizer 12. More specifically, a value Vd measured by, for example, a digital voltmeter 28 and the output level Vb of the digitizer 12 are supplied to the test processor 13 and in the test processor 13, the correction coefficient r at the calibration point closest to the frequency $f_1$ and the level Vb is searched for from the table shown in FIG. 4 to thereby calibrate the output level of the detecting circuit 27. Alternatively, the correction coefficient r at the frequency $f_1$ and the level Vb are calculated from the table of FIG. 4 by, for example, a linear interpolation method. Then, a ratio $k = r \cdot Vb/Vd$ between the calibrated value r·Vb for the measured value Vb measured by the digitizer 12 and the measured value Vd measured by the digital voltmeter 28 is calculated and employed as the correction coefficient k. The correction coefficient k is stored in the memory of the test processor 13.

The detecting circuit 27 is a conventional simple circuit composed of, for example, diodes D1, D2 and capacitors C1, C2, Cc as shown in a block 27 in FIG. 5. An input and output characteristic of the detecting circuit 27 is flat in the high frequency region in which an impedance of a coupling capacitor Cc can be neglected so that the input and output characteristic falls within the region of flat frequency characteristic. Also, if the level is calibrated by a certain frequency within the frequency region used in FIG. 2, for example, 50 kHz, the correction coefficient k thereof can be applied to a high frequency signal of frequency higher than 50 kHz, and the corrected level can be obtained by multiplying the output level of the detecting circuit 27 with the correction coefficient k.

While a large signal level in which the characteristics of the diodes D1 and D2 can be regarded as substantially linear characteristics may be calibrated at one level point, a low signal at which the characteristics of the diodes D1 and D2 present nonlinear characteristics are calibrated at a plurality of level points. The signal generator 26 can set approximate levels.

Figure 6:
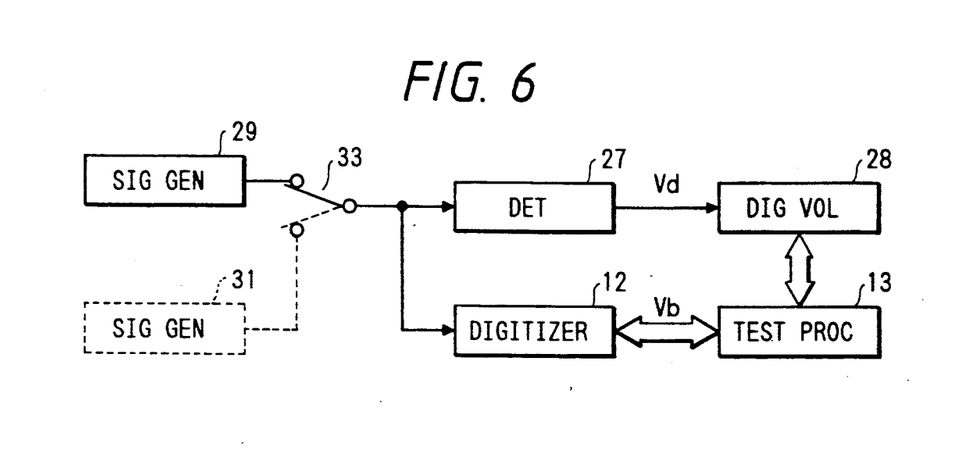
FIG. 6 is a block diagram showing an example of an arrangement for calibrating the level of waveform analyzing apparatus in the high frequency region according to the embodiment of the present invention.

As shown in FIG. 6, a signal generator 29 (the signal generator 29 may be identical with the signal generator 26 of FIG. 5) derives an alternate current signal (sine wave signal) having a frequency higher than the low frequency region (e.g., lower than 100 kHz) calibrated in FIG. 2 and preferably one of a plurality of levels substantially the same as those calibrated in FIGS. 2 and 5. This alternate current signal is input to the detecting circuit 27 calibrated in FIG. 5 and to the digitizer 12 calibrated in FIG. 2, whereby the output level Vb of the digitizer 12 is calibrated by the output level Vd of the detecting circuit 27 at that time. More specifically, the test processor 13 calculates a ratio $w = k \cdot Va/Vb$ between a corrected value $k \cdot Vd$ for the output level Vd of the detecting circuit 27 measured by the digital voltmeter 28 and the output level Vb of the digitizer 12 as the correction coefficient w. Then, a plurality of levels are calibrated at a plurality of frequencies higher than 100 kHz and the correction coefficients are stored in the memory of the test processor 13 as a table similar to that of FIG. 4. If necessary, as shown by a dashed line block 31, a high frequency signal generator 31 is provided and these signal generators 29 and 31 may be selectively switched by a switch 33 in response to the low band side and high band side of the calibrating frequency. As described above, the level of the digitizer 12 can be calibrated in a range of from low frequency to high frequency.

Figure 7:
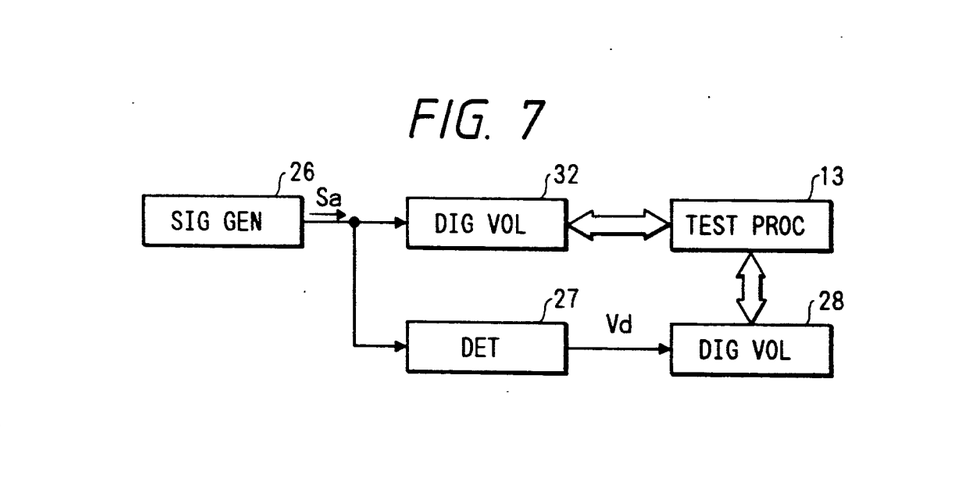
FIG. 7 is a block diagram showing other example of the arrangement in which the level of the detecting circuit is corrected.

In the above-mentioned embodiment, the calibrating procedure of FIG. 5 may be replaced with the following one. As shown in FIG. 7, the signal generator 26 derives a sine wave signal Sa having a frequency and level substantially the same as those used in the calibration procedure of FIG. 2, and this alternate current signal is supplied to a calibrated digital voltmeter 32 which can measure an alternate current and to the calibrated detecting circuit 27, whereby the output level of the detecting circuit 27 at that time is calibrated by a measured value of the digital voltmeter 32.

When the present invention is applied in order to calibrate the level of the digitizer incorporated in the analog test part of the IC tester, the level of the digitizer can be calibrated by utilizing various signal generators and various measuring apparatus provided in the analog test part at maximum.

Figure 8:
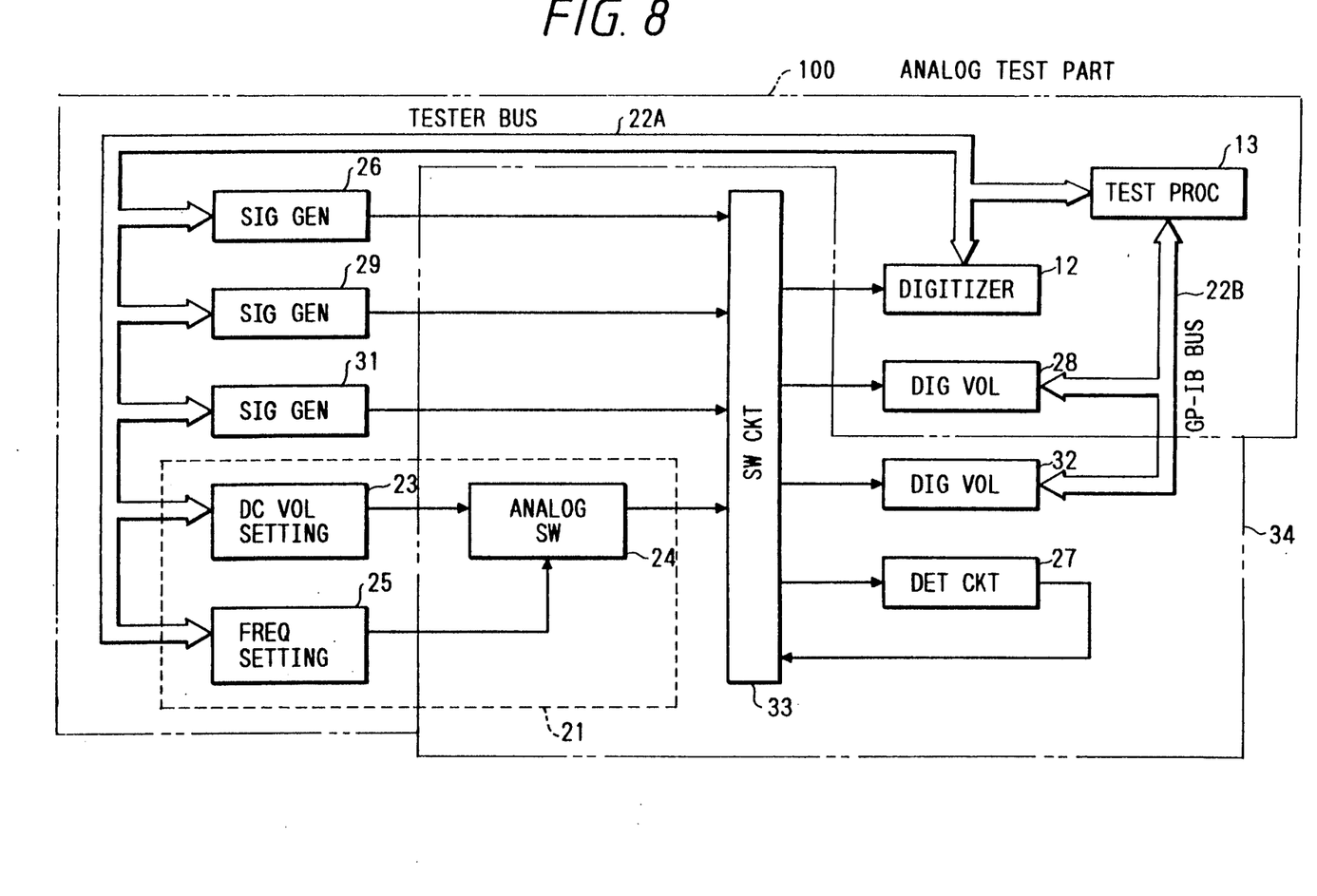
FIG. 8 is a block diagram showing an embodiment of calibration equipment in which the method of the present invention is applied to calibrate the level of the waveform analyzing apparatus of the IC tester.

More specifically, as shown in FIG. 8, when the present invention is applied to the case where the level of the digitizer 12 provided within an analog test part 100 of the digitizer 12 provided within an analog test part 100 of the IC tester is to be calibrated, the DC voltage setting circuit 23 and the frequency setting circuit 25 for setting the level and the frequency of the square wave signal Sq, respectively, are included in the analog test part 100 as earlier noted, and the signal generators 26, 29, 31 and the digital voltmeter 28 (an external digital voltmeter is used as the digital voltmeter 32 in this embodiment) and the test processor 13 shown in FIGS. 5 ad 6 are also included in the analog test part 100. Accordingly, it would suffice only to arrange such that the analog switch 24, the detecting circuit 27 and a switch circuit 33 are newly prepared on a performance board 34 on which IC's to be tested are mounted, and the desired outputs of various signal generators 21, 26, 29, 31 and detecting circuit 27 are connected to the desired inputs of the measuring apparatus 12, 27, 28, 32 and the detecting circuit 27 via the switch circuit 33. Therefore, it is not necessary to use the expensive standard signal generator. In addition, the calibration work can be performed by utilizing an exclusive tester bus 22A involved within the analog test part 100 so that the calibration can be performed in a short period of time.

In the above-mentioned embodiment, when the levels of the low frequency region in FIG. 2 are calibrated, the respective levels $V_3$, $V_5$ of odd order components, that is, ternary, quinary components $f_3$, $f_5$ can be determined theoretically by the voltage Vs of the square wave signal Sq, so that the levels of these frequency components can be calibrated. More specifically, when not so many frequency points to be calibrated in level are needed, only the frequency components (fundamental wave component and harmonic components) of the generated square wave signal are calibrated, whereby the set frequency of the frequency setting circuit 25 in FIG. 2 need not be changed. Therefore, the calibration can be carried out in a short period of time. The embodiment of the calibration method of this case will be described below.

Figure 9:
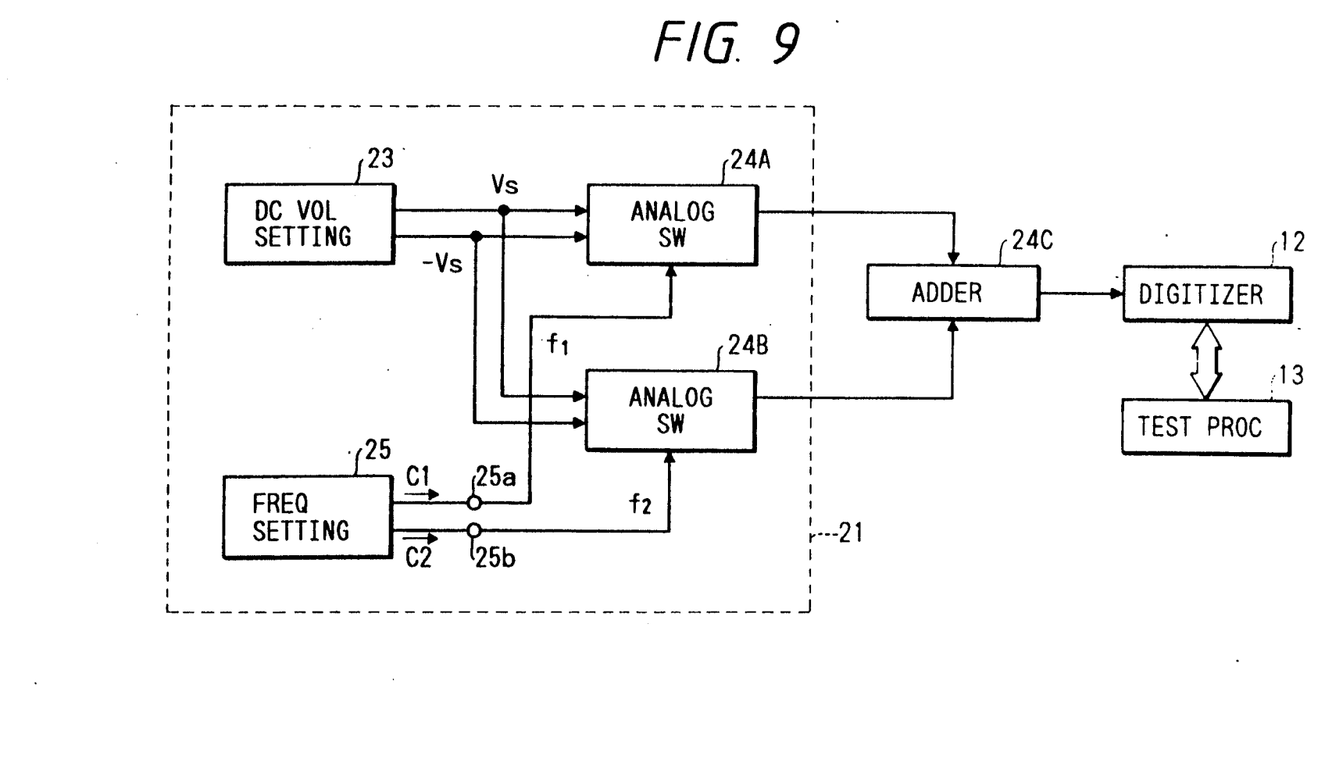
FIG. 9 is a block diagram showing an arrangement in which the level of the waveform analyzing apparatus is calibrated in the low frequency region.
Figure 10A:
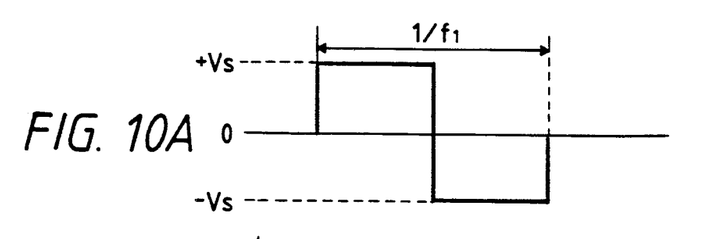
FIG. 10A is a waveform diagram of a square wave signal.

FIG. 9 shows an example of a circuit arrangement used in the correcting method of this embodiment in which the setting frequency of the square wave signal Sq is not changed and the calibration is performed by using the fundamental component and the harmonic components of the square wave signal Sq. In this embodiment, however, a synthesized signal of two square wave signals having different frequencies is utilized, and square waves of bipolar pulse are employed as these square waves. The DC voltage setting circuit 23 derives the set DC voltages $\pm Vs$ at high accuracy, and two output DC voltages $\pm Vs$ are supplied to analog switches 24A and 24B, respectively. The frequency setting circuit 25 supplies two square wave control signals $C_1$ and $C_2$ of predetermined duty ratios at two set frequencies to terminals 25a and 25b. The analog switches 24A and 24B are controlled by the control signals $C_1$ and $C_2$ applied to the terminals 25a and 25b. For example, if the duty ratio of the control signal $C_1$ is 50%, the analog switch 24A derives a square wave signal which has a duty ratio of 50% and a frequency $f_1$ and which alternately takes $+Vs$ and $-Vs$ as, for example, shown in FIG. 10A. In a like manner, the analog switch 24B derives a square wave signal which has a duty ratio of 50% and a frequency $f_2$ and which takes $+Vs$ and $-Vs$. The output square wave signals from these analog switches 24A and 24B are added by an adder 24C formed of, for example, an operational amplifier and the added signal is fed to the digitizer 12.

Figure 10B:
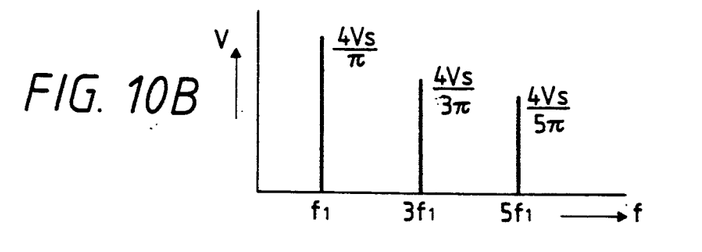
FIG. 10B is a diagram of frequency spectrum of the square wave signal.
Figure 11A:
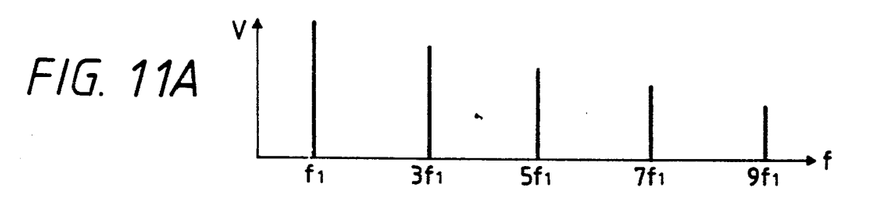
FIG. 11A is a diagram of frequency spectrum of a first square wave signal.
Figure 11B:
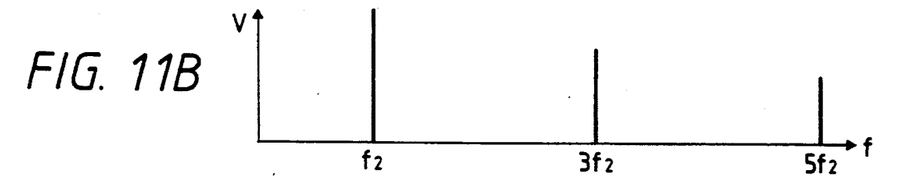
FIG. 11B is a diagram of frequency spectrum of a second square wave signal.
Figure 11C:
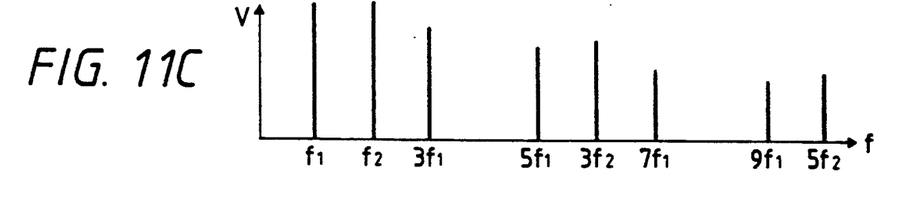
FIG. 11C is a diagram of frequency spectrum of a synthesized waveform of the first and second square wave signal.

The levels of frequencies of the output from the digitizer 12 are calibrated by using the amplitude of the input square wave signal, that is, the setting voltages ±Vs of the DC voltage setting circuit 23. In other words, the respective frequency components involved in the square wave signal and the levels of the respective frequency components can be calculated theoretically from the duty ratio, frequency and amplitude of the square wave signal. In the case of the square wave signal shown, for example, in FIG. 10A, the level of the fundamental wave of the frequency $f_1$ is calculated as $4Vs/\pi$ as Shown in FIG. 10B, and also, the level of ternary harmonic component $3f_1$ is calculated as $4Vs/3\pi$ and the level of quinary harmonic component frequency $5f_1$ is calculated as $4Vs/5\pi$. In practice, odd-order harmonic components of higher order are involved and the levels thereof are obtained by the calculation. The frequency components of the square wave signal output from the analog switch 24A are represented in FIG. 11A, the frequency components of the output square wave signal from the analog switch 24B are represented in FIG. 11B and the frequency components of the output from the adder 24C become a sum of the frequency components of FIG. 11A and the frequency components of FIG. 11B as shown in FIG. 11C. Accordingly, the digitizer 12 derives outputs concerning the frequency components $f_1$, $f_2$, $3f_1$, $5f_1$, $3f_2$, $7f_1$, . . . . The theoretical values of the respective levels of these frequency components are obtained by the calculation as mentioned before, and the correction coefficients r of the output levels of the corresponding frequency components of the digitizer 12 relative to the theoretical values of the respective frequency levels obtained by the calculation are calculated to calibrate the output levels of the digitizer 12 at its low frequency region.

A similar calibration may be performed by changing the setting voltage Vs of the voltage setting circuit 23, if necessary. Further, if necessary, a similar calibration may be performed by changing the setting frequencies $f_1$ and $f_2$ by the frequency setting circuit 25. Furthermore, if the operable frequency region of the digitizer 12 is limited to the low frequency region, only the calibration of the output level in FIG. 9 is needed and the calibration of the output levels of the high frequency region in FIGS. 6 and 7 need not be performed.

Figure 12:
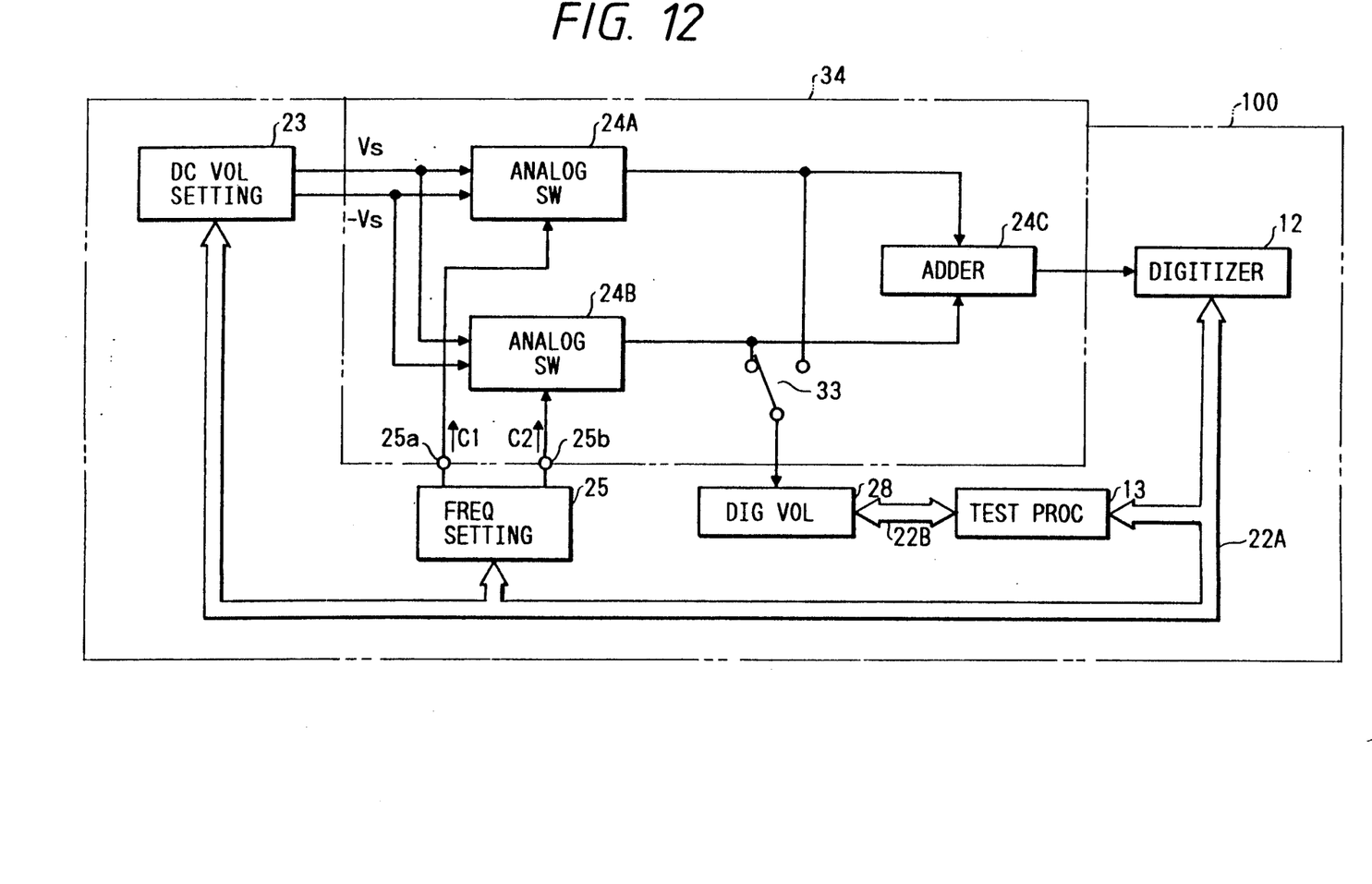
FIG. 12 is a block diagram showing an arrangement in which the method of FIG. 9 is applied to calibrate the level of the waveform analyzing apparatus of the IC tester.

When the level of the digitizer 12 provided in the analog test part 100 of the IC tester is calibrated by the calibration method of FIG. 9, the inputs of the adder 24 are connected, on the performance board 34 of the IC tester, to the analog switches 24A and 24B and the output of the adder 24C is connected to the input of the digitizer 12 as shown in FIG. 12. Then, the analog switches 24A and 24B are controlled by the square wave control signals $C_1$ and $C_2$ of the frequencies $f_1$ and $f_2$ from the output terminals 25a and 25b of the frequency setting circuit 25 to thereby derive square wave signals having preset amplitude (±Vs), predetermined duty ratio and different frequencies ($f_1$ and $f_2$), respectively. These square wave signals are added by the adder 24C mounted on the performance board 34 attached to the analog test portion 100 and the added signal from the adder 24C is supplied to the digitizer 12, thereby calibrating the level of the digitizer 12. The control operation for controlling the DC voltage setting circuit 23 and the frequency setting circuit 25 to set the voltage and the frequency can be performed by the test processor 13 of the IC tester via an exclusive tester bus 22A similarly to the case of FIG. 8A. If necessary, the respective outputs of the analog switches 24A and 24B are converted to DC outputs and the levels thereof are measured by the digital voltmeter 28, thus making it possible to measure the amplitude of the square wave signal at high accuracy.

While in FIG. 9 the two square wave signals having different frequencies are added and input to the digitizer 12, if much more square wave signals are added together and fed to the digitizer 12, it is possible to calibrate the levels of much more frequencies at a time.

As described above, according to this invention, the level is calibrated by the square wave signal whose absolute level is assured in the low frequency, the detecting circuit is calibrated in level and the level calibration in the high frequency is performed by utilizing the wide band characteristic of the calibrated detecting circuit. The square wave signal can be generated by the inexpensive, simple circuit arrangement, the detecting circuit may be made inexpensive, the signal generator used may be made inexpensive and the expensive standard signal generator is not needed.

Further, since with respect to the low frequency a plurality of square wave signals are simultaneously supplied to the digitizer and the respective levels of a plurality of frequency components simultaneously obtained from the digitizer are calibrated by the theoretical values of the levels of the respective frequency components of the square wave signal so that the levels can be calibrated with respect to the plurality of frequencies by one operation, all necessary calibrations can be performed in a short period of time.

Furthermore, while the present invention is applied to the case where the level of the digitizer is calibrated as described above, this invention is not limited thereto and can be applied to the calibration of a digital voltmeter which can measure both input square wave signal and sine wave signal, i.e. a simple waveform analyzing apparatus.

Having described preferred embodiments of the invention with reference to the accompanying drawings, it is to be understood that the invention is not limited to those precise embodiments and that various changes and modifications thereof could be effected by one skilled in the art without departing from the spirit or scope of the invention as defined in the appended claims.

What is claimed is:

1. A method of calibrating levels of a waveform analyzing apparatus, comprising the steps of:
   (a) a first calibrating step in which a square wave signal having a known amplitude is input to the waveform analyzing apparatus at a relatively low frequency to produce a first waveform analyzing apparatus output level and in which the first waveform analyzing apparatus output level produced from said waveform analyzing apparatus at that time is calibrated by a theoretical level of a frequency spectrum of said square wave signal;
   (b) a second calibrating step in which a sine wave signal of a first frequency substantially equal to said low frequency is generated from a first signal generator, is supplied to a calibrated level measuring means to produce a measured output level and is supplied to a diode detecting circuit to produce a first diode detecting circuit output level and in which the first diode detecting circuit output level produced from said diode detecting circuit at that time is calibrated by the measured output level produced from said calibrated level measuring means; and (c) a third calibrating step in which a sine wave signal of a second frequency higher than said first frequency is input to said diode detecting circuit from a second signal generator after calibrating in said step (b) to produce a second diode detecting circuit output level and is input to said waveform analyzing apparatus after calibration in said step (a) to produce a second waveform analyzing apparatus output level and in which the second waveform analyzing apparatus output level produced from said waveform analyzing apparatus is again calibrated by the second diode detecting circuit output level produced from said diode detecting circuit.

2. The method of claim 1, wherein said second calibrating step is performed by using as said calibrated level measuring means said waveform analyzing apparatus calibrated in said first calibrating step.

3. The method of claim 1, wherein said second calibrating step is performed by using as said calibrated level measuring means a calibrated digital voltmeter which can measure an alternating current signal.

4. The method of claim 1, wherein said first calibrating step calibrates a plurality of levels with respect to a plurality of frequencies of said square wave signal.

5. The method of claim 1, wherein said first frequency in said second calibrating step is selected in a range in which an input and output characteristic of said diode detecting circuit is substantially flat.

6. The method of claim 1, wherein said first calibrating step performs calibration based on theoretically calculated levels of a plurality of frequency spectra of said square wave signal.

7. The method of claim 1, wherein said first calibrating step includes a step in which a waveform, which results from synthesizing at least two said square wave signals having different frequencies, is input to said waveform analyzing apparatus and the first waveform analyzing apparatus output level produced from said waveform analyzing apparatus is calibrated to the theoretical calculation levels of a plurality of frequency spectra of said synthesized waveform.

8. A method of calibrating levels of a waveform analyzing apparatus, comprising the steps of:
   (1) adding and synthesizing a plurality of square wave signals of different frequencies having predetermined amplitudes and duty ratios to obtain a synthesized waveform signal, the frequencies of said plurality of square wave signals being selected such that the frequencies of harmonic components of said plurality of square wave signals differ from one another at least within a frequency region of interest;
   (2) supplying said synthesized waveform signal to a waveform analyzing apparatus; and
   (3) calibrating levels of corresponding frequency components obtained as an output of said waveform analyzing apparatus to theoretical calculation levels of a plurality of frequency spectra of said synthesized waveform signal.

* * * * *

UNITED STATES PATENT AND TRADEMARK OFFICE
CERTIFICATE OF CORRECTION

PATENT NO. : 5,138,267
DATED     : August 11, 1992
INVENTOR(S) : Komagata et al.

It is certified that error appears in the above-identified patent and that said Letters Patent is hereby corrected as shown below:

Title Page [56], References Cited:
    line 5, "4,023,093" should be --4,023,098--.

Col. 7, line 9, "Shown" should be --shown--.

Signed and Sealed this

Fifth Day of October, 1993

Attest:

BRUCE LEHMAN

Attesting Officer           Commissioner of Patents and Trademarks